United States Patent
Sturcken et al.

(10) Patent No.: US 10,064,277 B2
(45) Date of Patent: Aug. 28, 2018

(54) INTEGRATED PASSIVE DEVICES AND ASSEMBLIES INCLUDING SAME

(71) Applicant: Ferric Inc., New York, NY (US)

(72) Inventors: Noah Sturcken, New York, NY (US); Ryan Davies, New York, NY (US); Hao Wu, New York, NY (US); Michael Lekas, New York, NY (US)

(73) Assignee: Ferric, Inc., New York, NY (US)

( * ) Notice: Subject to any disclaimer, the term of this patent is extended or adjusted under 35 U.S.C. 154(b) by 107 days.

(21) Appl. No.: 15/084,046

(22) Filed: Mar. 29, 2016

(65) Prior Publication Data
US 2017/0290156 A1    Oct. 5, 2017

(51) Int. Cl.
| | |
|---|---|
| *H01L 23/522* | (2006.01) |
| *H05K 1/18* | (2006.01) |
| *H03H 7/38* | (2006.01) |
| *H01L 23/498* | (2006.01) |

(52) U.S. Cl.
CPC .......... *H05K 1/18* (2013.01); *H01L 23/49811* (2013.01); *H01L 23/5226* (2013.01); *H01L 23/5227* (2013.01); *H03H 7/38* (2013.01)

(58) Field of Classification Search
CPC .......... H01L 23/49811; H01L 23/5226; H01L 23/5227; H01L 23/481; H01L 23/49827; H01L 23/49822; H03H 7/38; H05K 1/18; H05K 1/181
See application file for complete search history.

(56) References Cited

U.S. PATENT DOCUMENTS

| | | | | |
|---|---|---|---|---|
| 2008/0272486 A1* | 11/2008 | Wang | ............ | H01L 21/563 257/737 |
| 2011/0101516 A1* | 5/2011 | Guzek | ............ | H01L 22/20 257/724 |
| 2014/0151892 A1* | 6/2014 | Kang | ............ | H01L 23/3107 257/774 |
| 2015/0228550 A1* | 8/2015 | Yu | ............ | H01L 25/0652 257/48 |
| 2015/0289360 A1* | 10/2015 | Leong | ............ | H01L 23/5221 361/782 |

OTHER PUBLICATIONS

N. Sturcken et al., "Design of Coupled Power Inductors with Crossed Anisotropy Magnetic Core for Integrated Power Conversion".
D. W. Lee et al., "Design and Fabrication of Integrated Solenoid Inductors with Magnetic Cores", Electronic Components and Technology Conference, 2008, p. 701-705, IEEE.
N. Sturcken et al., "A 2.5D Integrated Voltage Regulator Using Coupled-Magnetic-Core Inductors on Silicon Interposer Delivering 10.8A/mm(2)", Advances in Heterogeneous Integration, 2012, p. 3-5, Session 23.1, IEEE International Solid-State Circuits Conference.
N. A. Sturcken, "Integrated Voltage Regulators with Thin-Film Magnetic Power Inductors", 2013, Columbia University.

* cited by examiner

*Primary Examiner* — Jasmine Clark
(74) *Attorney, Agent, or Firm* — Intrinsic Law Corp.

(57) ABSTRACT

An integrated passive device and assemblies containing the same are disclosed. The integrated passive device can include a thin-film magnetic inductor. Various configurations of electrically connecting an integrated passive device to a processor and/or an interposer such as a chip-scale package are also disclosed.

42 Claims, 10 Drawing Sheets

INTEGRATED PASSIVE DEVICES AND ASSEMBLIES INCLUDING SAME

TECHNICAL FIELD

The present application relates generally to integrated passive devices and assemblies including the same.

BACKGROUND

An integrated passive device (IPD) is a passive electrical component that contains one or more passive electrical circuit element(s), such as an inductor, capacitor, resistor or some series and parallel combination of these elements. An IPD does not include "active" circuit devices such as transistors, as an IPD with transistors would be more conventionally described as an integrated circuit (IC).

The function of an IPD is generally to bring the circuit elements available on the IPD in electrical communication with a corresponding IC. In a system employing an IPD, the electrical components present on the IPD would typically not be available on the IC substrates for any number of reasons, such as convenience, cost or availability. The rationale for these design decisions may be because designers determined that certain passive devices are necessary to achieve the desired circuit function, but it would be too expensive to include these passive devices on the same CMOS die as the microprocessor, as this die would likely use leading edge CMOS fabrication processes (such as the 7 nm Fin-Fet transistor process), which substantially increase the cost of the IC. Inclusion of the thin-film magnetic inductors on the IC substrate would compound the process complexity and consequently impact manufacturing yield and cost.

It would be desirable to have an IPD with improved functionality. It would also be desirable to improve the performance of the IPD and IC by locating them as close as possible to one another.

SUMMARY

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure will be set forth in the following detailed description of the disclosure when considered in conjunction with the drawings.

In an aspect, the invention is directed to an integrated passive device. The integrated passive device includes a substrate; a first insulator layer disposed on the substrate; a multilevel wiring structure defined in the first insulator layer; and a thin-film magnetic inductor comprising at least a portion of the multilevel wiring structure. The inductor includes a first wiring plane of the multilevel wiring structure, the first wiring plane including a first metal wire. The inductor also includes a second wiring plane of the multilevel wiring structure, the second wiring plane including a second metal wire. The inductor also includes a vertical conductive interconnect (VIA) extending from the first wire to the second wire, the VIA electrically connecting the first and second wires. The inductor also includes a second insulator layer disposed between the first and second wiring planes. The inductor also includes a magnetic core disposed within the second insulator layer. The first metal wire, the VIA, and the second metal wire comprise a conductive winding around the magnetic core. The thin-film magnetic inductor has a height of 50 microns or less.

In another aspect, the invention is directed to an assembly. The assembly includes an interposer having a plurality of wire traces, the wire traces extending from a first side to a second side of the interposer, the first and second sides of the interposer on opposing sides of the interposer. The assembly also includes a processor chip disposed proximal to the first side of the interposer, the processor chip electrically connected to a first wire trace on the first side of the interposer. The assembly also includes a circuit board disposed proximal to the second side of the interposer, the circuit board in electrical communication with a second wire trace on the second side of the interposer. The assembly also includes a solder ball disposed between the interposer and the circuit board, the solder ball forming an electrical connection and a physical connection between the second wire trace on the interposer and a wire trace on the circuit board, the second solder ball forming a gap between the second side of the interposer and circuit board. The assembly also includes an integrated passive device (IPD) electrically connected to the second side of the interposer, the IPD embedded in the interposer. The IPD includes a substrate; a first insulator layer disposed on the substrate; a multilevel wiring structure defined in the first insulator layer; and a plurality of passive devices electrically connected to the multilevel wiring structure.

In another aspect, the invention is directed to an assembly. The assembly includes an interposer having a plurality of wire traces, the wire traces extending from a first side to a second side of the interposer, the first and second sides of the interposer on opposing sides of the interposer. The assembly also includes a processor chip disposed proximal to the first side of the interposer, the processor chip electrically connected to a first wire trace on the first side of the interposer. The assembly also includes a plurality of solder bumps disposed between the processor chip and the first side of the interposer, the solder bumps forming a plurality of gaps between adjacent solder bumps. The assembly also includes an integrated passive device (IPD) mounted on the processor chip, the IPD disposed in the gap. The IPD includes a substrate; a first insulator layer disposed on the substrate; a multilevel wiring structure defined in the first insulator layer; and a plurality of passive devices electrically connected to the multilevel wiring structure.

In another aspect, the invention is directed to an assembly. The assembly includes an interposer having a plurality of wire traces, the wire traces extending from a first side to a second side of the interposer, the first and second sides of the interposer on opposing sides of the interposer. The assembly also includes an integrated passive device (IPD) embedded in the interposer. The IPD includes a substrate; a first insulator layer disposed on the substrate; a multilevel wiring structure defined in the first insulator layer; and a plurality of passive devices electrically connected to the multilevel wiring structure.

BRIEF DESCRIPTION OF THE DRAWINGS

For a fuller understanding of the nature and advantages of the present invention, reference is made to the following detailed description of preferred embodiments and in connection with the accompanying drawings, in which.

DETAILED DESCRIPTION

Figure 1:
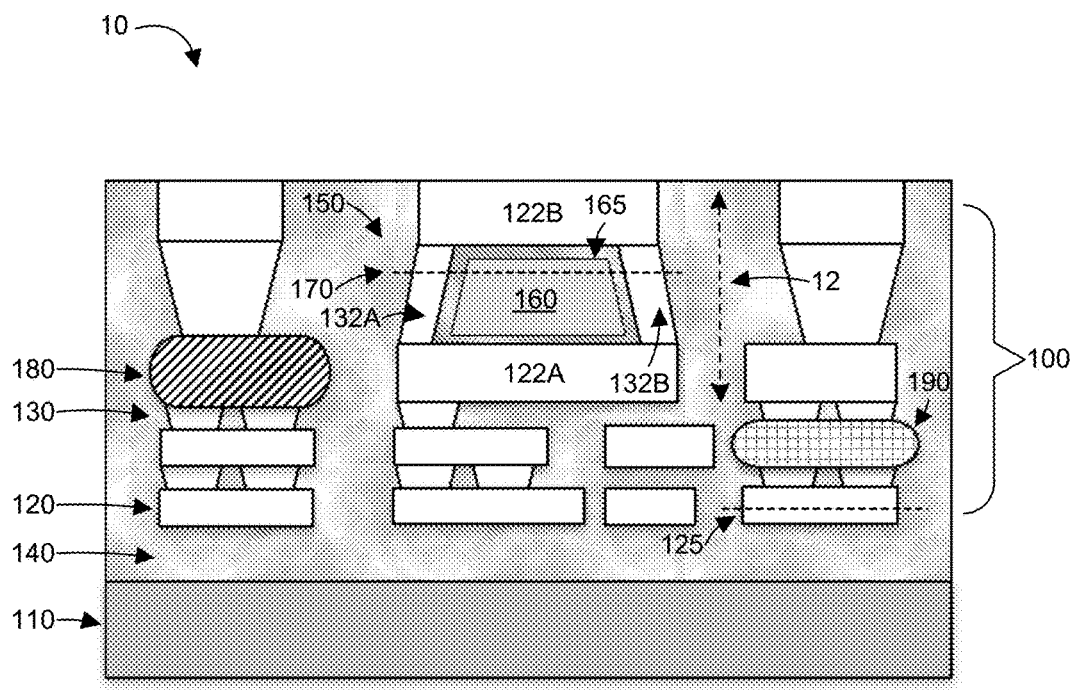
FIG. 1 illustrates a cross-sectional view of an integrated passive device according to one or more embodiments.

FIG. 1 illustrates a cross-sectional view of an integrated passive device 10 according to one or more embodiments. IPD 10 comprises a multilevel wiring structure 100 disposed on a substrate 110. Multilevel wiring structure 100 includes metal wiring levels 120 and vertical conductive interconnects or VIAs 130. Metal wiring levels 120 and VIAs 130 are constructed out of a conductive material, such as copper and/or aluminum. Metal wiring levels 120 and VIAs 130 can include additional layers such as titanium, titanium nitride, tantalum, tantalum nitride, or other layers. It is noted that multilevel wiring structure 100 can include additional or fewer metal wiring levels 120 and/or VIAs 130. The spaces in the wiring structure 100 are filled with a dielectric insulating material 140, such as silicon dioxide or silicon nitride.

A thin film magnetic inductor 150 is integrated into at least a portion of multilevel wiring structure 100. An example of an inductor integrated into a multilevel wiring structure is disclosed in U.S. patent application Ser. No. 13/609,391, filed on Sep. 11, 2012, entitled "Magnetic Core Inductor Integrated with Multilevel Wiring Network," which is incorporated herein by reference. The '391 Application is assigned to the same assignee as the present application.

The inductor 150 includes a single planar magnetic core 160. The principal plane 170 of the planar magnetic core 160 is substantially parallel with the planes (e.g., plane 125) defining each metal layer 120. The conductive winding or coil of the inductor 150, forming a general spiral on the outside of the planar magnetic core 160, is piecewise constructed of wire segments 122A, 122B and of VIAs 132A, 132B. The wire segments 122A, 122B forming the winding pertain to at least two of the metal wiring levels 120 and the VIAs 132A, 132B that form the parts of the windings that are orthogonal to the principal plane 170 are interconnecting the at least two wiring metal wiring levels 120. An insulator 165, such as silicon dioxide or silicon nitride, is disposed around the core 160.

In some embodiments, inductor 150 has a small height 12, such as less than about 50 microns. The small height 12 provides a low profile for inductor 150, allowing it to be integrated into IPD 10 in various locations and/or configurations. A representative thickness of wire segments 122A/122B is about 1 μm to about 20 μm, about 5 μm to about 15 μm, about 10 μm, or any value or range between any two of the foregoing thicknesses. A representative thickness of magnetic core 160 is about 1 μm to about 20 μm, about 5 μm to about 15 μm, about 10 μm, or any value or range between any two of the foregoing thicknesses. Therefore a representative thickness of VIAs 132A/132B is slightly larger than about 1 μm to about 20 μm, such as about 2 μm to about 22 μm or any value or range of the sum of the thickness of wire segments 122A/122B and core 160. The VIAs 132A/132B can also have a thickness greater than 22 μm up to an including about 40 μm, such as about 25 μm, about 30 μm, about 35 μm, or any value or range between any two of the foregoing thicknesses. A representative thickness of insulator layer 165 is about 1 to about 10,000 nm, including about 2,500 nm, about 5,000 nm, about 7,500 nm, or any value or range between any two of the foregoing thicknesses. As used herein, "about" means plus or minus 10% of the relevant value.

The substrate 110 can include silicon, silicon dioxide, silicon nitride, a layered silicon-insulator structure (e.g., silicon on insulator or SOI), silicon germanium, or a III-V structure such as aluminum gallium arsenide.

IPD 10 can also include optional components shown as representative structures 180, 190, which can include one or more capacitors (e.g., trench capacitors, MIM capacitors, etc.), resistors, transformers, diodes, and/or inductors. Such components, including inductor 150, can be electrically coupled in series, in parallel, or a combination thereof, to one another. For example, an inductor in the IPD, such as inductor 150, can form a portion of a switched inductor power converter circuit. In another example, IPD 10 can include one or more capacitors that form a resonant impedance matching circuit, which, in combination with an inductor (e.g., inductor 150) and/or a transformer can provide impedance transformation at a particular frequency band. In another example, the components of IPD 10 form an electromagnetic interference (EMI) filter. In another example, the components of IPD 10 form a balun. In another example, the components of IPD 10 form at least one of a transformer, an antenna, or a magnetometer (e.g., a magnetic sensor). Of course, the IPD 10 can include two or more of the structures or features described above (e.g., a portion of a switched inductor power converter circuit and a balun).

Figure 2:
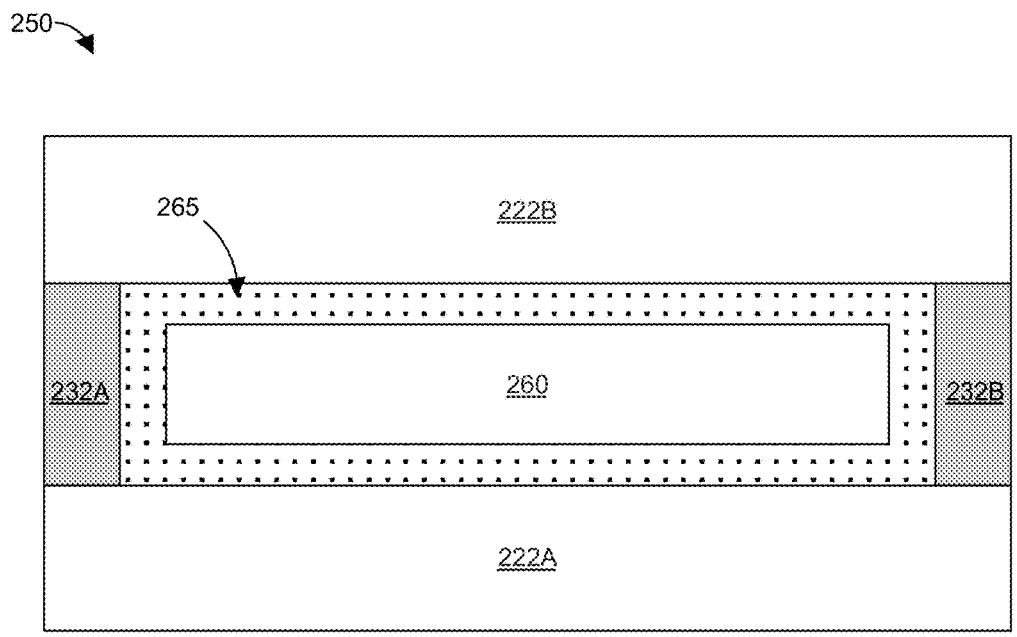
FIG. 2 illustrates a cross section of an exemplary inductor according to one or more embodiments.

FIG. 2 illustrates a cross section of an exemplary inductor 250 according to one or more embodiments. The inductor 250 can be the same as inductor 150 described above. The inductor 250 includes first and second conductive wiring layers 222A, 222B that are electrically connected by conducting VIAs 232A, 232B. The conductive wiring layers 222A, 222B and VIAs 232A, 232B form a conductive winding or coil around a magnetic core 260. The magnetic core 260 can include several layers of electrically insulting materials that prevent the magnetic core or inductor coil from electrically coupling in an undesirable way. These insulating materials are generally vapor deposited dielectrics such as SiO2 or photoimageable polymer layers such as polyimide. In some embodiments, the core 260 includes a magnetic layer and a non-magnetic layer or a plurality of such layers in a laminate configuration of alternating magnetic and non-magnetic layers, as discussed below.

An insulation layer and/or a passivation layer 265 is disposed around the core 260. The insulation/passivation layer 265 can include silicon dioxide, a polyimide, and/or a ferromagnetic polymer composite material (i.e., a "magnetic polymer"). The magnetic polymer includes ferromagnetic particles disposed in a polymer matrix, as discussed herein. In some embodiments, insulation/passivation layer 265 is partially disposed around core 260. Insulation/passivation layer 265 is disposed between core 260 and one or more of the respective electrical conductors (e.g., conductive wiring layers 222A, 222B and VIAs 232A, 232B).

Figure 3:
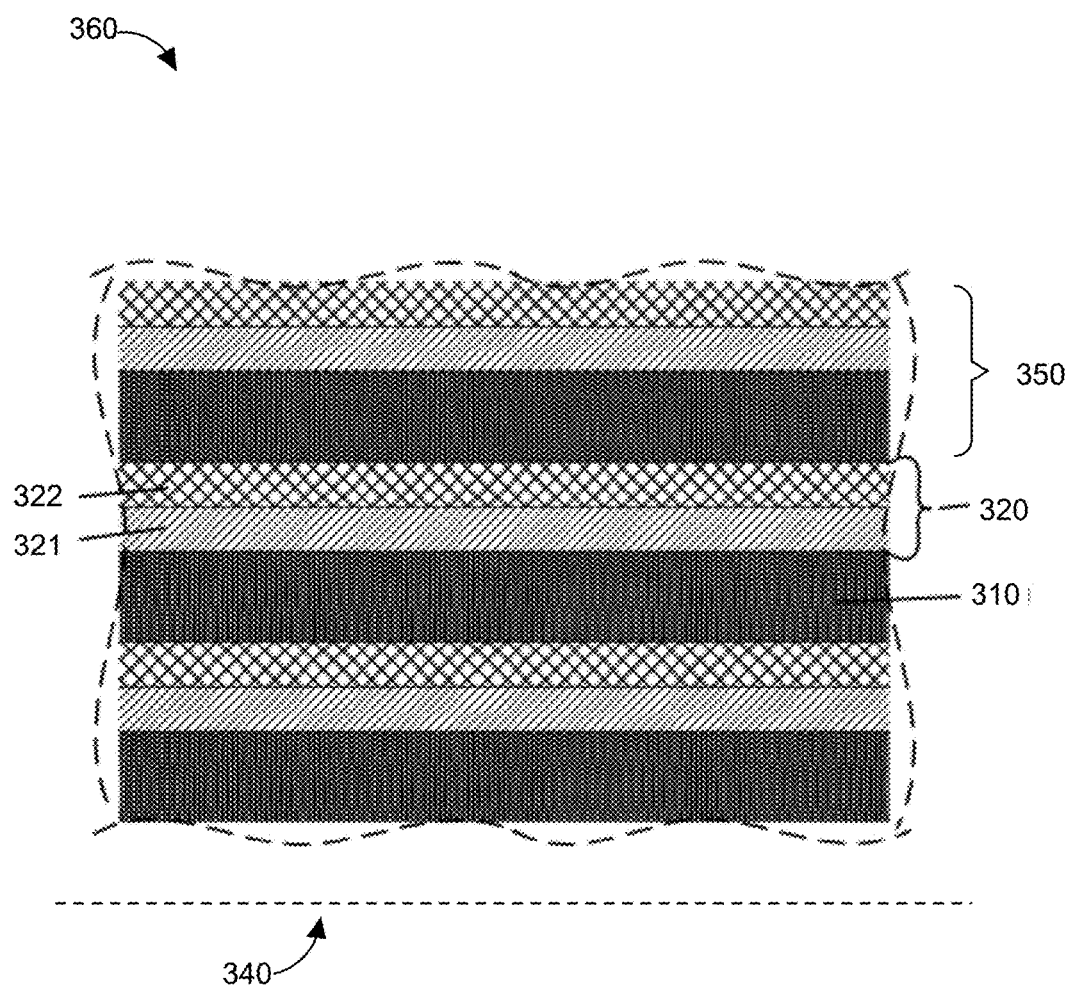
FIG. 3 is a cross sectional view of a laminated core according to one or more embodiments.

FIG. 3 is a cross sectional view of a laminated core 360 according to one or more embodiments. The core 360 can be incorporated into the inductor 150 and/or 250 discussed above. The laminated configuration of core 360 includes at least one layer of a magnetic material 310 and at least one non-magnetic layer 320. The purpose of the non-magnetic layer 320 is to prevent electrical current circulation in the planar magnetic core 360 perpendicularly to the principal plane 340, which is parallel with the lamination layers 310, 320. In a typical embodiment of the disclosure the magnetic core 360 can include an alternating sequence of up to about 100 layers each, or about 2 to 50 periods 350 of the layers. FIG. 3 shows 3 periods 350 of the layers, where each period 350 includes a magnetic layer 310 and a non-magnetic layer 320.

By way of example, without intent of limiting, the magnetic layer 310 can include CZT, or Co(x)Zr(y)Ta(1-x-y), with x and y being about 0.915 and about 0.04, respectively. The non-magnetic layer 320 can include a dielectric or insulator, such as $SiO_2$ or CoO (including a material or compound having any ratio of cobalt to oxygen atoms), and/or a metal such as Ta and/or its related oxides and/or nitrides (e.g., $Ta_2O_5$, TaN, etc.). In some embodiments, non-magnetic layer 320 includes a magnetic polymer material. In some embodiments, non-magnetic layer 320 itself can be composed of more than one constituent layers. For example, the component layers of non-magnetic layer 320 can include an insulator layer 321 and a metal layer 322. The insulator layer 321 can include $SiO_2$, SiN (including a material or compound having any ratio of silicon to nitrogen atoms), CoO (including a material or compound having any ratio of cobalt to oxygen atoms), polymers such as polyimide, and/or a magnetic polymer. The metal layer 322 can include Ta, W, Ti, and/or any of these metals' respective oxides or nitrides (e.g., $Ta_2O_5$, TaN, $W_2O_3$, $W_2N$, $TiO_2$, and/or TiN). The purpose of the insulating layer 321 can be to prevent electrical current circulation in the planar magnetic core perpendicularly to the principal plane 340. Such perpendicular currents are known in the art as eddy currents, and they would lead to energy losses for the inductor. The purpose of the metal layer 322, such as Ta, can be to ease fabrication by smoothing the surface during deposition. The non-magnetic layer 320 can have structures and properties beyond those of simply having constituent layers. In some embodiments of the present invention the non-magnetic layer 320 can have current rectifying properties. For example, the non-magnetic layer 320 can include a semiconducting layer and an interface metal layer, the interface layer disposed between the semiconducting layer and the magnetic layer 310. The semiconducting layer can be a p-type semiconductor having a work function less than the work function of magnetic layer 310. Alternatively, the semiconducting layer can be an n-type semiconductor having a work function greater than magnetic layer 310. The interface metal layer can have a work function less than that of the p-type semiconducting material, or greater than that of the n-type semiconducting material. In some embodiments, the non-magnetic layer 320 includes semiconducting materials that form a p-n junction (or n-p junction). In some embodiments, the non-magnetic layer 320 includes a Schottky diode.

The sequential deposition of the various layers of the laminated structure of core 360 can include some techniques known in the semiconductor processing arts, for instance, masking, sputtering, electroplating. The fabrication of one or more components or layers of laminated magnetic core 360 may be done in the presence of an applied magnetic field to magnetically orient the deposited magnetic layers 310, such as to orient the easy or hard axis of magnetization. The thickness of the non-magnetic layers 320 may be in the range of about 5 nm to about 100 nm, about 20 nm to about 80 nm, about 40 nm to about 60 nm, about 50 nm, or any thickness between any two of the foregoing values. The thickness of the magnetic layers 210 can be about 10 nm to about 1000 nm, about 50 nm to about 500 nm, about 100 nm to about 400 nm, about 200 nm to about 300 nm, about 250 nm, or any thickness between any two of the foregoing values. Of course, one may be able to apply other magnetic materials, such as Ni and Fe, and other layers, or means, to suppress eddy currents. Embodiments of the present invention do not limit any of these choices.

Considering the nature of its materials and its structural requirements, representative embodiments of the invention may use differing general approaches for fabricating the planar laminated magnetic cores and couplers. A general approach may be centered on sputtering and/or electroplating.

An example of a magnetic core, including a core having a laminate configuration, can be found in U.S. patent application Ser. No. 13/609,391, filed on Sep. 11, 2012, entitled "Magnetic Core Inductor Integrated with Multilevel Wiring Network," and U.S. patent application Ser. No. 14/571,649, filed on Dec. 16, 2014, entitled "Systems and Methods for Integrated Multi-Layer Magnetic Films," which are incorporated herein by reference. The '391 and '649 applications are assigned to the same assignee as the present application.

Figure 4:
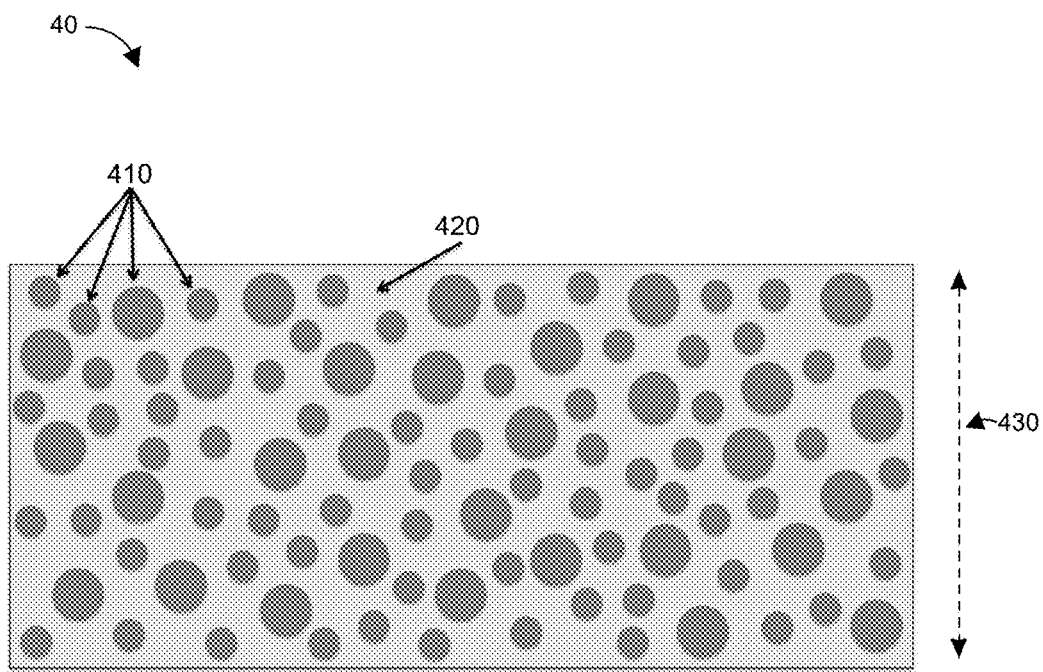
FIG. 4 illustrates a side view of a magnetic polymer layer according one or more embodiments.

FIG. 4 illustrates a side view of a magnetic polymer layer 40 according one or more embodiments. The magnetic polymer 40 can be incorporated in the inductor 150, inductor 250, and/or core 360 described above. The magnetic polymer layer 40 includes ferromagnetic particles 410 disposed in a polymer matrix 420. The ferromagnetic particles 410 are formed of one or more soft ferromagnetic materials or alloys or oxides thereof. For example, the ferromagnetic particles 410 can include at least one of Co, Ni, Fe, and/or their respective oxides. The ferromagnetic particles 410 can have a size (e.g., length or diameter), an average size, or a median size of less than or equal to about 10 microns, for example about 2 to about 7 microns, about 3 to about 6 microns, or about 5 microns, or about 5 to about 100 nanometers.

The polymer matrix 420 can be a dielectric (e.g., liquid or spin-on deposited dielectric) such as silicon dioxide (SiO2), a photoimageable polymer (e.g., a photoresist) such as a polyimide, polymethylmethacrylate or polydimethylsiloxane, or a non-photoimageable polymer such as an epoxy.

The magnetic polymer 40 can be manufactured by disposing ferromagnetic particles 410 in the polymer matrix 420 and mixing the constituent parts using any mixing method that provides an approximately homogeneous distribution of the ferromagnetic particles 410 in the polymer matrix 420. The homogeneous distribution is determined by achieving a similar concentration (e.g., plus or minus 10% variation in concentration) of ferromagnetic particles 410 per unit volume across the entire volume of the polymer matrix 420.

The weight ratio of ferromagnetic particles 410 to polymer matrix 420 can range from about 1:10 to the highest weight ratio of ferromagnetic particles 410 to polymer 420 that allows for the magnetic polymer 40 to be successfully processed as a passivation or insulation layer (e.g., allows the polymer 420 to have a low enough viscosity to be able to spin on the wafer or substrate completely for photolithography processing). In some embodiments, the highest weight ratio of ferromagnetic particles 410 to polymer 420 is typically about 1:1.

An example of a magnetic polymer is described by the present Applicant in U.S. patent application Ser. No. 15/053,747, filed on Feb. 25, 2016, entitled "Systems and Methods for Microelectronics Fabrication and Packaging Using a Magnetic Polymer," which is incorporated herein by reference. The '747 Application is assigned to the same assignee as the present application.

An advantage of using a magnetic polymer 40 in an inductor (e.g., in inductor 150, 250 and/or core 360) is that it can provide a net increase in the effective inductance by reducing the total magnetic reluctance for magnetic flux induced by the inductor coil, which is composed of electrical conductors (e.g., conductive wiring layers 222A, 222B and VIAs 232A, 232B). As a result, the inductor can exhibit an inductance enhancement and conversion efficiency improvement for power converter systems where embodiments of the invention can be applied.

Further, magnetic polymer 40 can attenuate radiated electromagnetic energy from power inductor devices to reduce undesirable electromagnetic interference (EMI). This EMI benefit can also be applied to other electrical circuit applications that either generate EMI or are adversely affected by EMI, where the attenuation of EMI is desirable.

In some embodiments, the magnetic polymer 40 can be biased with a magnetic field to form an anisotropic structure. A magnetic field can be applied to polymer layer 420 during or after curing to induce magnetic anisotropy in polymer layer 420. The magnetic field is applied so that it passes through epoxy layer 420 parallel to its height 430. In response to the magnetic field, the easy axis of magnetization aligns with the magnetic field (i.e., parallel to height 430), which causes the hard axis of magnetization to align orthogonally to height 430 (e.g., along its length or width). For example, the hard axis of magnetization can be parallel or substantially parallel to the principal plane 340 of core 360. Such magnetic alignment techniques are described by the present Applicant in further detail in U.S. patent application Ser. No. 14/746,994, filed on Jun. 23, 2015, entitled "Apparatus and Methods for Magnetic Core Inductors with Biased Permeability," which is incorporated herein by reference. The '994 Application is assigned to the same assignee as the present application.

Figure 5:
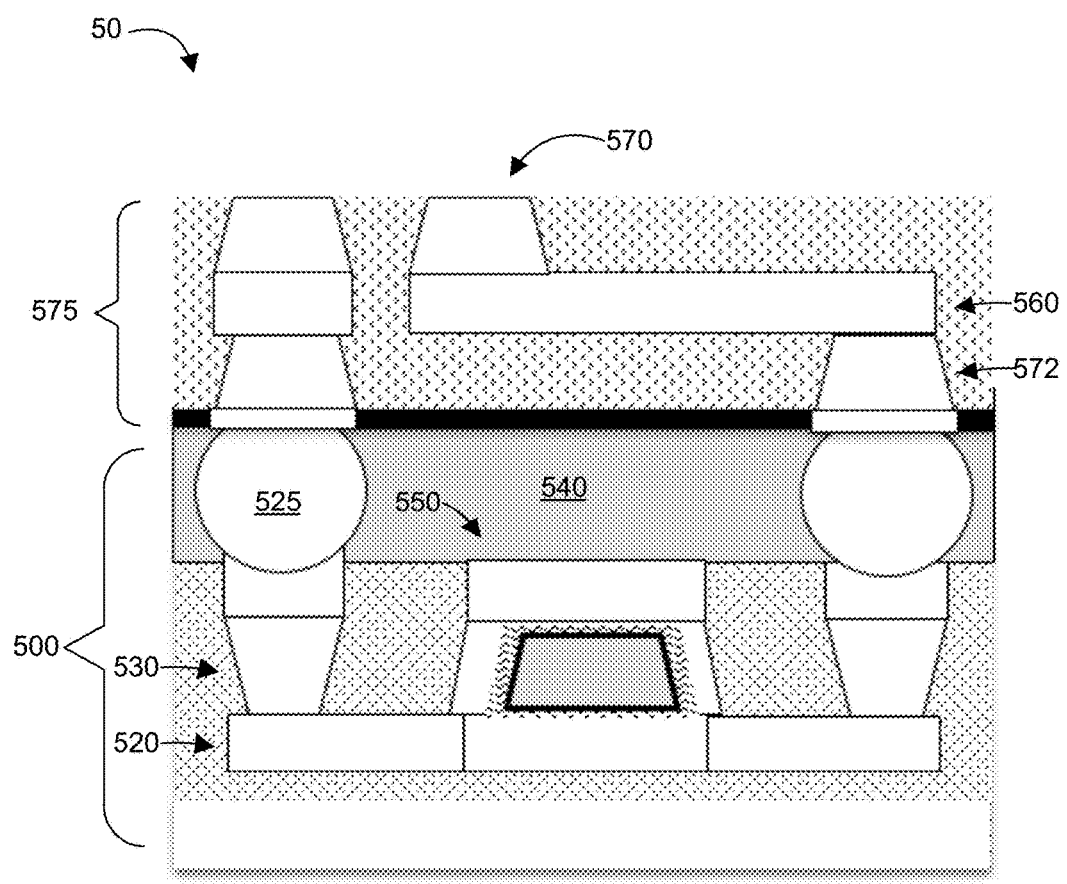
FIG. 5 illustrates a cross-sectional view of an assembly comprising an IPD flip-chip attached to structure according to one or more embodiments.

FIG. 5 illustrates a cross-sectional view of an assembly 50 comprising an IPD 500 flip-chip attached to structure 575 according to one or more embodiments. IPD 500 can be substantially the same as IPD 10 discussed above. For ease of illustration, IPD 500 includes fewer metal wiring levels 520 and VIAs 530 than IPD 10. Also for ease of illustration, IPD 500 includes inductor 550 but does not include the representative structures 180, 190 that are included in IPD 10. However, IPD 500 can include additional metal wiring levels and/or one or more representative structures in one or more embodiments.

Structure 575 can be an integrated circuit/processor chip, a system on a chip (SoC), a package substrate, an interposer (e.g., a silicon interposer), or other structure, though only a portion of structure 575 is illustrated in FIG. 5 for clarity. Structure 575 includes one or more conductive wire levels 560 and one or more conductive VIAs 570 that electrically connect adjacent levels of conductive wire 560. One row of VIAs 572 electrically connects structure 575 to contacts 525 in IPD 500. Contacts 525 can be C4 contacts, solder bumps, copper pillars, or similar contact structure known in the art.

Through structure 575, IPD 500 can be in electrical communication with a processor chip or a system on a chip (SoC), either directly and/or indirectly. In the direct electrical communication configuration, structure 575 includes the processor chip or SoC and IPD 500 is electrically coupled to the processor chip/SoC (structure 575). In the indirect electrical communication configuration, structure 575 includes a package substrate, an interposer, or other structure, which itself is connected directly or indirectly to a processor chip or SoC. Thus, IPD 500 electrically communicates with processor chip or SoC through structure 575 (e.g., through traces or wiring in a package substrate).

The processor/SoC and IPD 500 in combination can form various types of circuits and functionality. For example, when the IPD 500 includes one or more inductors (e.g., thin-film magnetic inductors as described herein), the combined apparatus can form an integrated power converter or other device that includes an inductor. In another example, the combined apparatus forms an impedance matching circuit that can provide an impedance transformation at a particular frequency band. In another example, the combined apparatus can provide an electromagnetic interference (EMI) filter or a balun. The combined apparatus can also provide an antenna or a transformer. The combined apparatus can also provide an isolating data buffer (e.g., a digital isolator) that uses transformers to communicate electrical signals from input to output with isolated DC voltages. The combined apparatus can provide any number of additional functions, alone or in combination with the above, as would be appreciated by those skilled in the art.

Underfill epoxy 540 is disposed around contacts 525 and at the interface with structure 575. The epoxy 540 can provide adhesion with structure 575 and can provide electrical insulation between contacts 525 and structure 575. Thus, the epoxy 540 provides a physical connection between IPD 500 and structure 575. The epoxy 540 can be a thermoset polymer such as a composite of a polymer resin and hardener that can be thermally cured after flowing between contacts 225 and structure 275. In some embodiments, underfill epoxy 540 includes a magnetic polymer.

Figure 6:
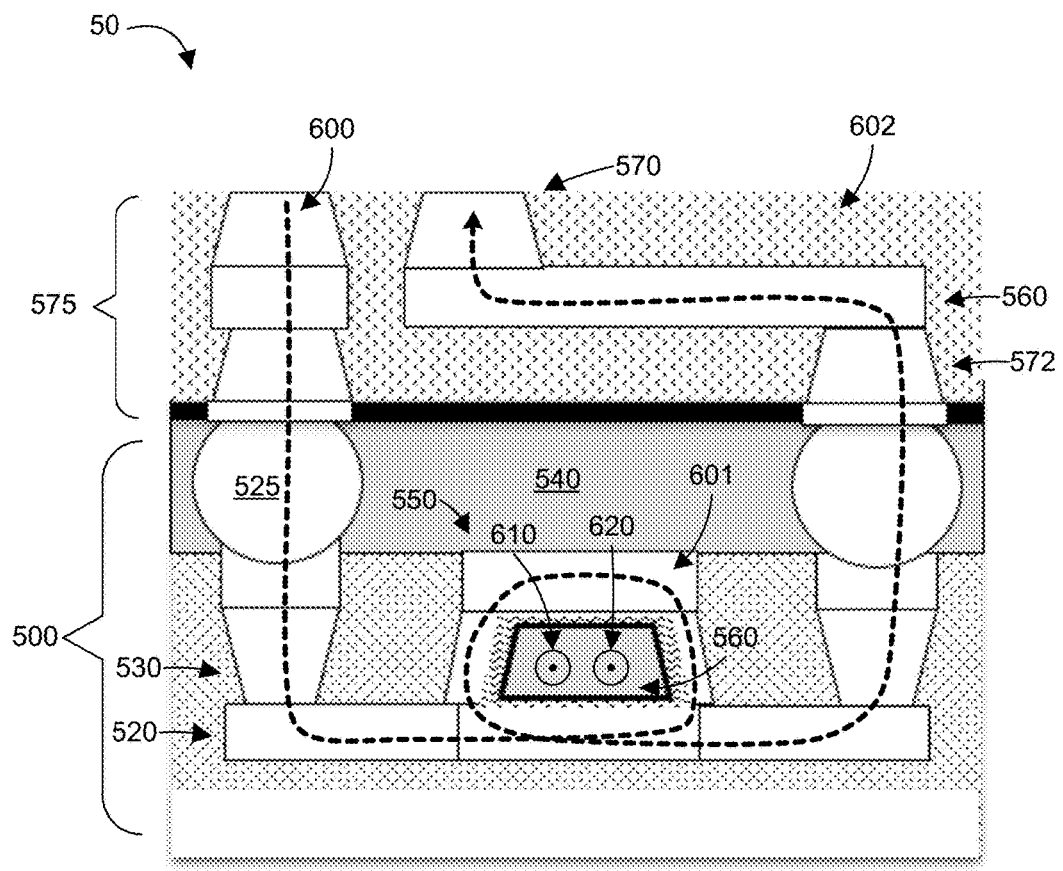
FIG. 6 illustrates the electrical current path and corresponding induced magnetic fields of the assembly illustrated in FIG. 5 according to one or more embodiments.

FIG. 6 illustrates the electrical current path 600 and corresponding induced magnetic fields 610, 620 of assembly 50 according to one or more embodiments. The current flows along current path 600 from VIAs 570 on the left-hand side of structure 575 to contact 525 on IPD 500. As illustrated, the current then flows down to metal wiring level 520 and around the coil/windings of inductor 550 in a counterclockwise direction. After passing through the coil/windings, the current returns to metal wire 520 and then up VIA 530 on the right-hand side of IPD 500 to contact 525 at which point the current flows back to structure 575. In structure 575, the current passes through connecting VIA 572, metal wire 560, and VIA 570.

In general, the electrical current path 600 includes two loops 601, 602 in which the current flows in series in a counterclockwise direction. One counterclockwise loop 601 is around the coil or windings of inductor 550. The other counterclockwise loop 602 is the overall current path 600 where the current flows down VIAs 570, 530 on the left-hand side of FIG. 6, from left to right across metal wire 520, up VIAs 530, 572 on the right-hand side of FIG. 6, and from right to left across metal wire 560. Counterclockwise loop 601 induces magnetic field 610 that flows out of the plane of the page. Likewise, counterclockwise loop 602 induces magnetic field 620 that flows out of the plane of the page. Of course, the current can flow in different directions including the opposite direction as current path 600 illustrated in FIG. 6.

The assembly 60 is configured and arranged so the magnetic field 620 induced by loop 602 aligns with the magnetic field 610 induced by loop 601 in the region of core 560 of inductor 550. By aligning the magnetic fields 610, 620 in the region of core 560, the IPD 500 and structure 575 are magnetically coupled in addition to being electrically and physical coupled as discussed above. The alignment of magnetic fields 610, 620 at core 560 can increase the total inductance of inductor 550 by about 0.1 to about 10 nano-henries, including about 0.5 nano-henries, about 1 nano-henries, about 2 nano-henries, about 4 nano-henries, about 6 nano-henries, about 8 nano-henries, or any value or range between any two of the foregoing inductances.

Figure 7:
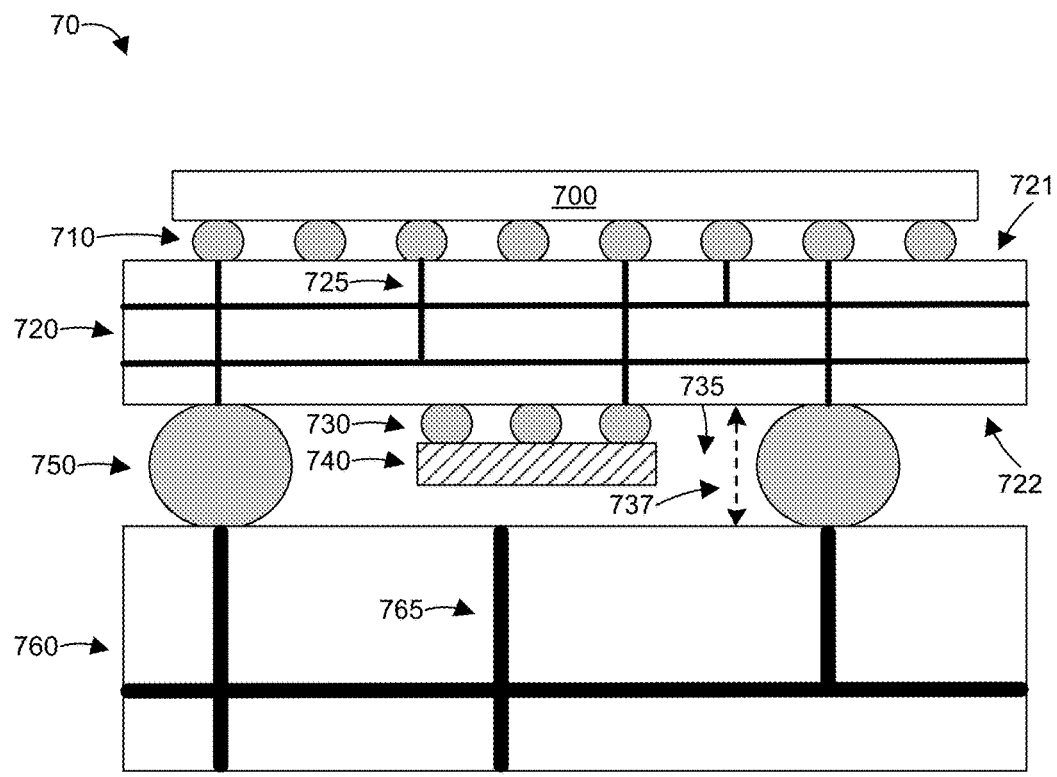
FIG. 7 is a cross section of an assembly according to one or more embodiments.

FIG. 7 is a cross section of an assembly 70 according to one or more embodiments. The assembly 70 includes an integrated circuit chip or system on a chip (in general, "SoC") 700, an interposer 720, an IPD 740, and circuit board 760. Bumps 710 are disposed between SoC 700 and a first side 721 (or chip side) of interposer 720 and form an electrical connection therebetween. Bumps 710 can include solder bumps (e.g., a bump grid array), microbumps, copper pillars, through-silicon VIAs (TSVs), surface mount technology (SMT) pads, and/or plain exposed conductive terminals finished with Au or other material that resists corrosion. Bumps 710 are sized to make an electrical connection between a chip pad on SoC 700 and a wire trace 725 in interposer 720. The bumps 710 can have a pitch of about 1 mm or less, including about 0.75 mm, about 0.5 mm, about 0.4 mm, about 0.3 mm, about 0.2 mm, about 0.1 mm, or any value or range between any two of the foregoing pitches. The height of bumps 710 can be about 0.01 mm to about 0.1 mm, including about 0.025 mm, about 0.050 mm, about 0.075 mm, or any value or range between any two of the foregoing heights. The width of bumps 710 can be about 0.20 mm to about 0.02 mm, including about 0.05 mm, about 0.10 mm, about 0.015 mm, or any value or range between any two of the foregoing widths. Bumps 710 can be formed at least partially out of Cu, Au, SnPb, SnPbAu, SnAg, SnAgCu, Pb-free solder materials, and/or other substances known in the art.

Balls 750 are disposed between a second side 722 of interposer 720 and circuit board 760 and form an electrical connection (e.g., a flip chip attachment) therebetween. Solder balls 750 are sized to make an electrical connection between a wire trace 725 in interposer 720 and a wire trace 765 in circuit board 760. The balls 750 can have a pitch of about 0.1 mm to about 2.0 mm, including about 0.25 mm, about 0.50 mm, about 0.75 mm, about 1.0 mm, about 1.25 mm, about 1.50 mm, about 1.75 mm, or any value or range between any two of the foregoing pitches. The balls 750 can have a height of about 0.1 mm to about 0.75 mm, including about 0.2 mm, about 0.3 mm, about 0.5 mm, about 0.7 mm, or any value or range between any two of the foregoing heights. The balls 750 can have a width of about 0.1 mm to about 0.75 mm, including about 0.2 mm, about 0.3 mm, about 0.5 mm, about 0.7 mm, or any value or range between any two of the foregoing widths. In some embodiments balls 750 form a ball grid array. Balls 750 can be formed out of SnPb, SnPbAu, SnAg, SnAgCu Pb-free solder materials, and/or other substance known in the art.

IPD 740 is disposed in a gap 735 defined by adjacent balls 750, the second side 722 (or land side) of interposer 720 and circuit board 760. The gap 735 has a height 737 less than or equal to the height of balls 750. IPD 740 is electrically connected to the second side 722 of interposer 720 through bumps 730. Bumps 730 can be the same or similar to bumps 710 described above. The bumps 730 electrically connect a pad on IPD 740 with one or more traces 725 in interposer 720. IPD 740 has a form factor to fit in gap 735. For example, IPD 740 is less wide than the width between adjacent balls 750. Similarly, IPD 740 has a height less than the height between the second side 722 of interposer 720 and the adjacent side of circuit board 760. Through interposer 720 and bumps 710, 730, IPD 740 is in electrical communication with SoC 700. The length of the electrical connection between IPD 740 and SoC 700 can be shorter (and thus faster) than when the IPD and SoC are connected to the same side of the interposer (e.g., FIG. 10).

In some embodiments, IPD 740 can include one or more features of the IPDs, inductors, and/or magnetic cores described above, such as with respect to FIGS. 1-6. In some embodiments, IPD 740 has a thickness of about 200 microns or less, about 150 microns or less, about 100 microns or less, about 75 microns or less, or any thickness between any two of the foregoing values. The conductive wiring layers in IPD 740 (e.g., metal wire levels and VIAs) can have a resistance of about 400 mOhm or less, about 200 mOhm or less, about 100 mOhm or less, or about 50 mOhm or less, or any value or range between any two of the foregoing resistance values.

In some embodiments, interposer 720 can be a chip scale package (CSP), a semiconductor package substrate, or similar device.

Figure 8:
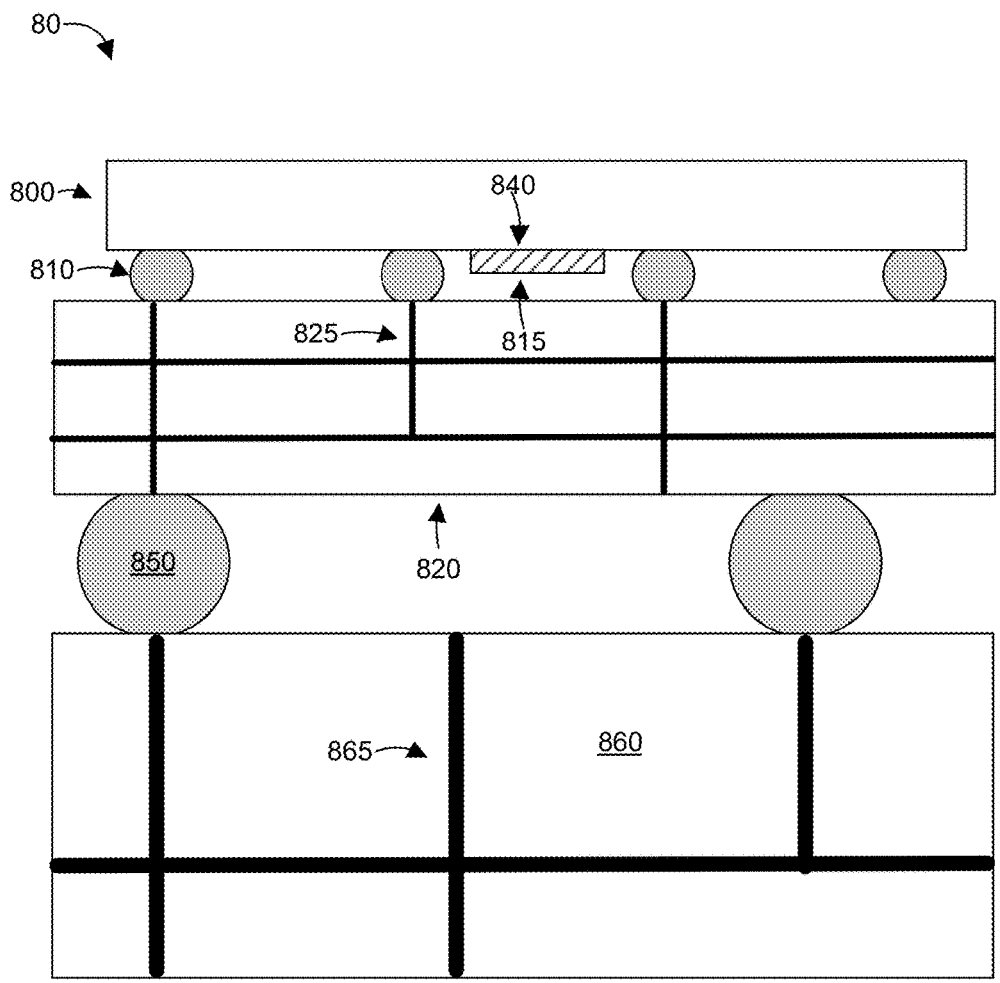
FIG. 8 is a cross section of an assembly according to one or more embodiments.

FIG. 8 is a cross section of an assembly 80 according to one or more embodiments. The assembly 80 includes an integrated circuit chip or system on a chip (in general, "SoC") 800, an interposer 820, an IPD 840, and circuit board 860, each of which can be the same, substantially the same, or different than the corresponding components in assembly 70. Unlike assembly 70, IPD 840 is directly mounted on SoC 800 in a gap 815 defined by adjacent bumps 810, interposer 820, and SoC 800. IPD 840 has a form factor to fit in gap 815. For example, IPD 840 is less wide than the width between adjacent bumps 810. Similarly, IPD 840 has a height less than the height between opposing surfaces of SoC 800 and interposer 820. The mounting of IPD 840 on SoC 800 can be through a flip chip attachment, for example as described above with respect to FIGS. 5 and 6. The length of the electrical connection between IPD 840 and SoC 800 can be shorter (and thus faster) than when the IPD and SoC are connected to the same side of an interposer (e.g., FIG. 10) or when the IPD and SoC are connected to opposing sides of an interposer (e.g., FIG. 7).

Similar to assembly 70, traces 865 in circuit board 860 are electrically connected to traces 825 in interposer 820 through solder balls 850.

In some embodiments, IPD 840 can include one or more features of the IPDs, inductors, and/or magnetic cores described above, such as with respect to FIGS. 1-6. In some embodiments, IPD 840 has a thickness of about 100 microns or less, about 75 microns or less, or any thickness between any two of the foregoing values. The conductive wiring layers in IPD 840 (e.g., metal wire levels and VIAs) can have a resistance of about 100 mOhm or less, about 90 mOhm or less, about 80 mOhm or less, or about 70 mOhm or less, or any value or range between any two of the foregoing resistance values.

In some embodiments, interposer 820 can be a chip scale package (CSP), a semiconductor package substrate, or similar device.

Figure 9:
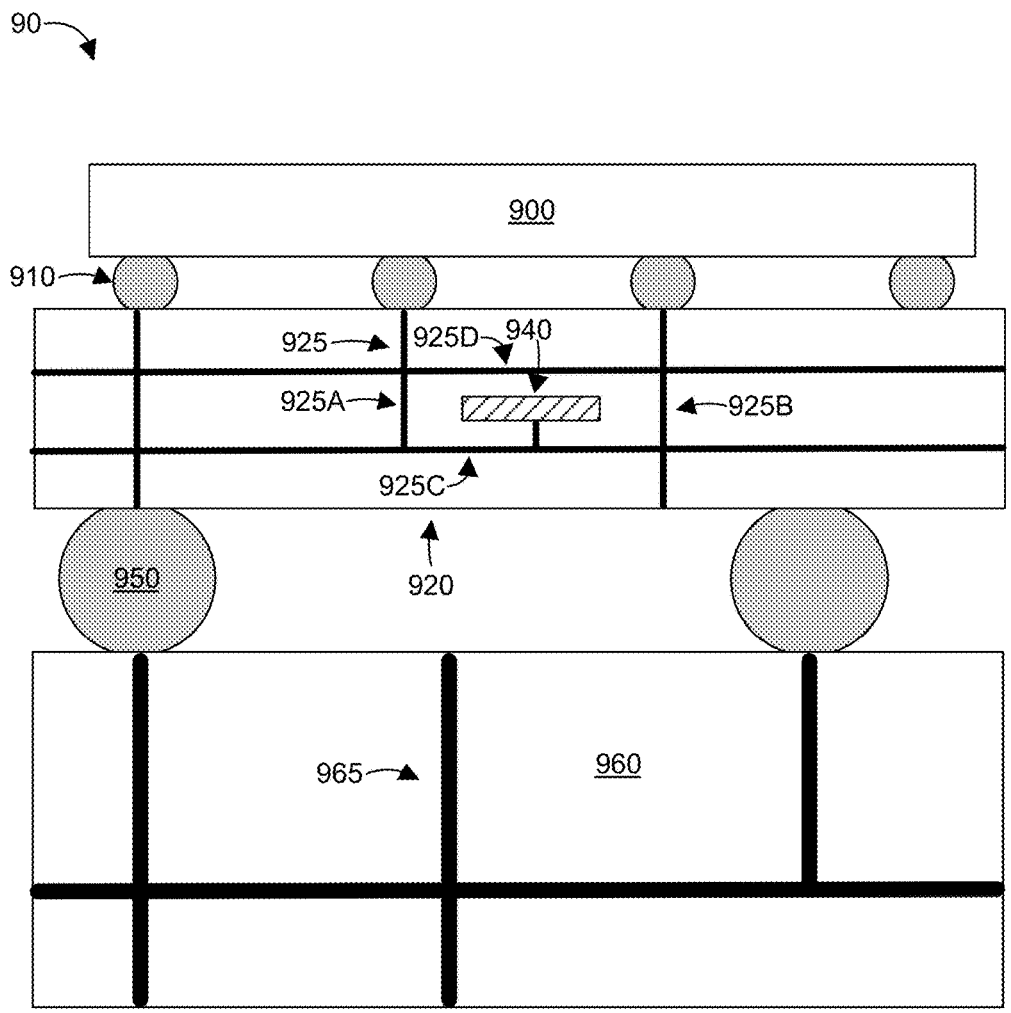
FIG. 9 is a cross section of an assembly according to one or more embodiments.

FIG. 9 is a cross section of an assembly 90 according to one or more embodiments. The assembly 90 includes an integrated circuit chip or system on a chip (in general, "SoC") 900, an interposer 920, an IPD 940, and circuit board 960, each of which can be the same, substantially the same, or different than the corresponding components in assembly 70 or 80. In assembly 90, IPD 940 is embedded in interposer 920. For example, IPD 940 can be disposed in a hole, a void, a depression, an aperture, or other space defined in interposer 920. The hole, void, depression, aperture or other space can be defined by any standard microelectronic fabrication technique such as photolithography, wet or dry etch, focused ion beam, mechanical milling, molding, etc. IPD 940 is electrically connected to traces 925 in interposer 920 through which IPD 940 is in electrical communication with SoC 900 through bumps 910.

IPD 940 has a form factor to fit in interposer 920, such as between traces 925. For example, IPD 940 is less wide than the width between adjacent traces 925A, 925B. Similarly, IPD 940 has a height less than the height between adjacent traces 925C, 925D. The mounting of IPD 940 in interposer 920 can be through a flip chip attachment or wire bonding. The length of the electrical connection between IPD 940 and SoC 900 can be shorter (and thus faster) than when the IPD and SoC are connected to the same side of an interposer (e.g., FIG. 10) and when the IPD and SoC are connected to opposing sides of an interposer (e.g., FIG. 7). Although not illustrated, additional IPDs can be embedded in interposer 920.

Similar to assembly 70 and/or 80 traces 965 in circuit board 960 are electrically connected to traces 925 in interposer 920 through solder balls 950.

In some embodiments, IPD 940 can include one or more features of the IPDs, inductors, and/or magnetic cores described above, such as with respect to FIGS. 1-6. In some embodiments, IPD 940 has a thickness of about 200 microns or less, about 150 microns or less, about 100 microns or less, about 75 microns or less, or any thickness between any two of the foregoing values. The conductive wiring layers in IPD 940 (e.g., metal wire levels and VIAs) can have a resistance of about 500 mOhm or less, about 400 mOhm or less, about 300 mOhm or less, about 200 mOhm or less, about 100 mOhm or less, about 50 mOhm or less, or any value or range between any two of the foregoing resistance values.

In some embodiments, interposer 920 can be a chip scale package (CSP), a semiconductor package substrate, or similar device.

Figure 10:
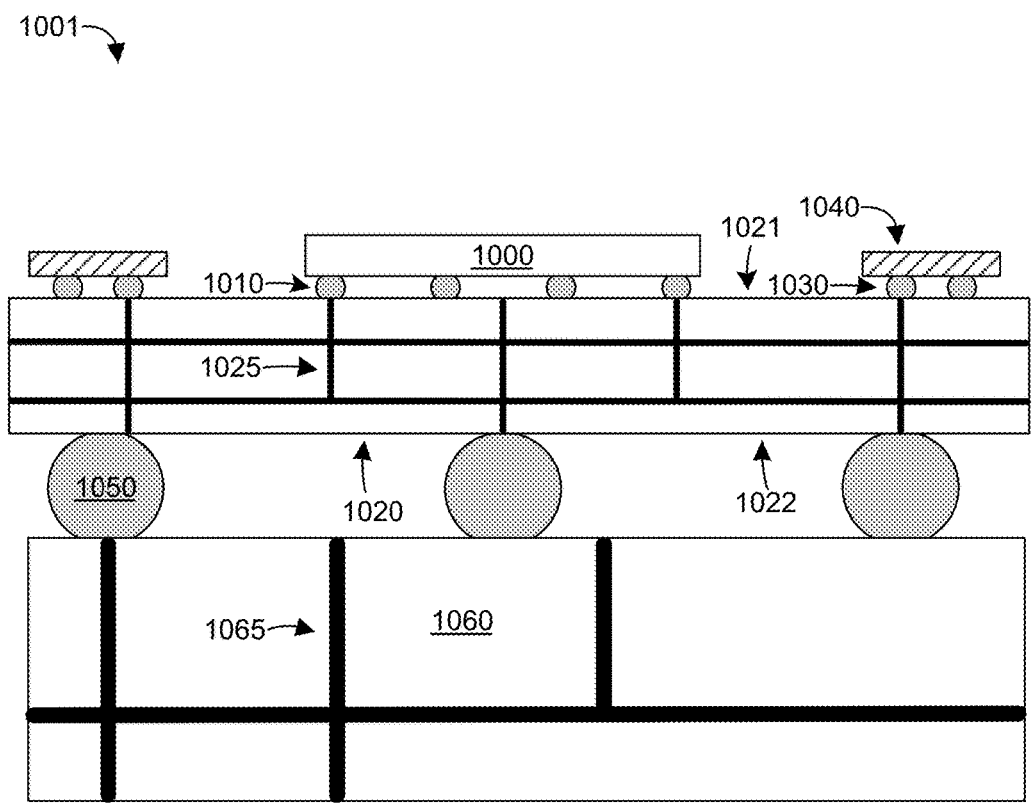
FIG. 10 is a cross section of an assembly according to one or more embodiments.

FIG. 10 is a cross section of an assembly 1001 according to one or more embodiments. The assembly 1001 includes an integrated circuit chip or system on a chip (in general, "SoC") 1000, an interposer 1020, IPDs 1040, and circuit board 1060, each of which can be the same, substantially the same, or different than the corresponding components in assembly 70, 80, or 90. In assembly 1001, each IPD 1040 is flip chip attached to a first side 1021 (or die side) of interposer 1020.

Bumps 1010 are disposed between SoC 1000 and the first side of interposer 1020 and form an electrical connection therebetween. In addition, bumps 1030 are disposed between IPD 1040 and interposer 1020 and form an electrical connection therebetween. Thus, SoC 1000 is in electrical communication with IPD 1040 through bumps 1010, traces 1025, and bumps 1030. Bumps 1010 and 1030 can be the same or different than the bumps described above, for example with respect to FIG. 7.

Similar to assembly 70, 80, and/or 90 traces 1065 in circuit board 1060 are electrically connected to traces 1025 on second side 1022 of interposer 1020 through solder balls 1050.

In some embodiments, IPD 1040 can include one or more features of the IPDs, inductors, and/or magnetic cores described above, such as with respect to FIGS. 1-6. In some embodiments, IPD 1040 has a thickness of about about 400 microns or less, about 300 microns or less, about 200 microns or less, about 150 microns or less, about 100 microns or less, or any thickness between any two of the foregoing values. The conductive wiring layers in IPD 1040 (e.g., metal wire levels and VIAs) can have a resistance of about 100 mOhm or less, about 90 mOhm or less, about 80 mOhm or less, or about 70 mOhm or less, or any resistance between any two of the foregoing values.

In some embodiments, interposer 1020 can be a chip scale package (CSP), a semiconductor package substrate, or similar device.

The various configurations of IPDs discussed above in FIGS. 7-10 can be combined and are not mutually exclusive. For example, an assembly can include one or more IPDs directly mounted on a SoC (e.g., FIG. 8) and one or more IPDs mounted on a second or land side of an interposer (e.g., FIG. 7). In another example, an assembly can include one or more IPDs directly mounted on a SoC (e.g., FIG. 8) and one or more IPDs embedded in an interposer (e.g., FIG. 9). In another example, an assembly can include one or more IPDs mounted on a second or land side of an interposer (e.g., FIG. 7) and one or more IPDs embedded in an interposer (e.g., FIG. 9). In another example, an assembly can include one or more IPDs directly mounted on a SoC (e.g., FIG. 8) and one or more IPDs mounted on a first or die side of an interposer (e.g., FIG. 10). In another example, an assembly can include one or more IPDs mounted on a second or land side of an interposer (e.g., FIG. 7) and one or more IPDs mounted on a first or die side of an interposer (e.g., FIG. 10). In another example, an assembly can include one or more IPDs embedded in an interposer (e.g., FIG. 9) and one or more IPDs mounted on a first or die side of an interposer (e.g., FIG. 10). In another example, an assembly can include one or more IPDs directly mounted on a SoC (e.g., FIG. 8), one or more IPDs mounted on a second or land side of an interposer (e.g., FIG. 7), one or more IPDs embedded in an interposer (e.g., FIG. 9), and/or one or more IPDs mounted on a first or die side of an interposer (e.g., FIG. 10).

Therefore, it can be appreciated that the disclosure provides various embodiments and mounting configurations of integrated passive devices. The IPDs include various passive devices, which can include a thin-film magnetic inductor. The IPDs can have a form factor so they can be mounted on a processor chip/SoC, on a chip scale package or interposer (land side and/or die side), and/or embedded in a chip scale package or interposer. The passive devices in the IPD can be used by the processor/SoC to perform various functions, such as an integrated power converter. The IPD also offloads manufacturing processing steps (and associated cost and yield loss) from the processor chip/SoC, which typically requires advanced manufacturing techniques that are not needed for manufacturing the passive devices in the IPD.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

What is claimed is:

1. An integrated passive device comprising:
   a substrate;
   a first insulator layer disposed on the substrate;
   a multilevel wiring structure defined in the first insulator layer; and
   a thin-film magnetic inductor comprising at least a portion of the multilevel wiring structure, the inductor including:
      a first wiring plane of the multilevel wiring structure, the first wiring plane including a first metal wire;
      a second wiring plane of the multilevel wiring structure, the second wiring plane including a second metal wire;
      a vertical conductive interconnect (VIA) extending from the first wire to the second wire, the VIA electrically connecting the first and second wires;
      a second insulator layer disposed between the first and second wiring planes; and
      a magnetic core disposed within the second insulator layer,
      wherein the first metal wire, the VIA, and the second metal wire comprise a conductive winding around the magnetic core, and
      wherein the thin-film magnetic inductor has a height of 50 microns or less.

2. The integrated passive device of claim 1, wherein the magnetic core has a laminated configuration comprising an alternating configuration of a layer of magnetic material and an insulator layer, wherein said insulator layer comprises an oxide of said magnetic material.

3. The integrated passive device of claim 2, wherein the insulator layer includes a magnetic polymer.

4. The integrated passive device of claim 1, wherein the magnetic core has a laminated configuration comprising an alternating configuration of a layer of a magnetic material and a current rectifying layer.

5. The integrated passive device of claim 4, wherein the current rectifying layer comprises a p-type semiconductor, the p-type semiconductor having a first work function less than a second work function of the magnetic material.

6. The integrated passive device of claim 5, wherein the laminated configuration further comprises an interface metal layer disposed on said p-type semiconductor, the interface layer having a work function less than said first work function of said p-type semiconductor, the interface layer disposed between the p-type semiconductor and the layer of magnetic material.

7. The integrated passive device of claim 1, wherein the second insulator layer includes a magnetic polymer.

8. An assembly comprising:
   an interposer having a plurality of wire traces, the wire traces extending from a first side to a second side of the interposer, the first and second sides of the interposer on opposing sides of the interposer;
   a processor chip disposed proximal to the first side of the interposer, the processor chip electrically connected to a first wire trace on the first side of the interposer;
   a circuit board disposed proximal to the second side of the interposer, the circuit board in electrical communication with a second wire trace on the second side of the interposer;
   a solder ball disposed between the interposer and the circuit board, the solder ball forming an electrical connection and a physical connection between the second wire trace on the interposer and a wire trace on the circuit board, the solder ball forming a gap between the second side of the interposer and the circuit board; and
   an integrated passive device (IPD) electrically connected to the second side of the interposer, the IPD disposed in the gap, the IPD including:
      a substrate;
      a first insulator layer disposed on the substrate;
      a multilevel wiring structure defined in the first insulator layer; and
      a plurality of passive devices electrically connected to the multilevel wiring structure.

9. The assembly of claim 8, wherein the IPD is electrically connected to the second side of the interposer through a plurality of solder bumps.

10. The assembly of claim 9, wherein at least one of the solder bumps is electrically connected to a third wire trace on the second side of the interposer.

11. The assembly of claim 8, wherein the at least one of the solder bumps is physically connected to the third wire trace on the second side of the interposer.

12. The assembly of claim 8, wherein the processor chip is electrically connected to the first side of the interposer through a plurality of solder bumps.

13. The assembly of claim 8, further comprising a system on a chip (SoC) in electrical communication with the interposer, the SoC including the processor.

14. The assembly of claim 8, wherein at least one of the passive devices includes a thin-film magnetic inductor comprising at least a portion of the multilevel wiring structure, the inductor including:
   a first wiring plane of the multilevel wiring structure, the first wiring plane including a first metal wire;
   a second wiring plane of the multilevel wiring structure, the second wiring plane including a second metal wire;
   a vertical conductive interconnect (VIA) extending from the first wire to the second wire, the VIA electrically connecting the first and second wires;
   a second insulator layer disposed between the first and second wiring planes; and
   a magnetic core disposed in a hole defined in the second insulator layer,
   wherein the first metal wire, the VIA, and the second metal wire comprise a conductive winding around the magnetic core.

15. The assembly of claim 14, wherein the IPD has a height less than or equal to 150 microns.

16. The assembly of claim 14, wherein the IPD and the processor chip form an integrated power converter.

17. The assembly of claim 14, wherein the inductor has a height of 50 microns or less.

18. The assembly of claim 14, wherein a multilevel wiring structure in the processor chip is configured and arranged such that an electrical current passes through (a) at least a portion of the multilevel wiring structure in the processor and (b) at least a portion of the multilevel wiring structure in the IPD including the inductor, such that the electrical current induces a first magnetic field that passes through the core of the inductor.

19. The assembly of claim 18, wherein the inductor induces a second magnetic field that passes through the core, the first and second magnetic fields oriented in a same direction.

20. The assembly of claim 14, wherein at least one of the passive devices includes at least one capacitor that forms a resonant impedance matching circuit.

21. The assembly of claim 20, wherein the impedance matching circuit and the inductor provide an impedance transformation at a particular frequency band.

22. The assembly of claim 14, wherein at least one of the passive devices includes at least one capacitor that forms a low-pass filter.

23. An assembly comprising:
an interposer having a plurality of wire traces, the wire traces extending from a first side to a second side of the interposer, the first and second sides of the interposer on opposing sides of the interposer;
a processor chip disposed proximal to the first side of the interposer, the processor chip electrically connected to a first wire trace on the first side of the interposer;
a plurality of solder bumps disposed between the processor chip and the first side of the interposer, the solder bumps forming a plurality of gaps between adjacent solder bumps; and
an integrated passive device (IPD) mounted on the processor chip, the IPD disposed in the gap, the IPD including
a substrate;
a first insulator layer disposed on the substrate;
a multilevel wiring structure defined in the first insulator layer; and
a plurality of passive devices electrically connected to the multilevel wiring structure;
wherein at least one of the passive devices includes a thin-film magnetic inductor comprising at least a portion of the multilevel wiring structure, the inductor including:
a first wiring plane of the multilevel wiring structure, the first wiring plane including a first metal wire;
a second wiring plane of the multilevel wiring structure, the second wiring plane including a second metal wire;
a vertical conductive interconnect (VIA) extending from the first wire to the second wire, the VIA electrically connecting the first and second wires;
a second insulator layer disposed between the first and second wiring planes; and
a magnetic core disposed in a hole defined in the second insulator layer,
wherein the first metal wire, the VIA, and the second metal wire comprise a conductive winding around the magnetic core.

24. The assembly of claim 23, wherein the IPD has a height less than or equal to 50 microns.

25. The assembly of claim 23, wherein the IPD and the processor chip form an integrated power converter.

26. The assembly of claim 23, wherein the inductor has a height of 50 microns or less.

27. The assembly of claim 23, wherein a multilevel wiring structure in the processor chip is configured and arranged such that an electrical current passes through (a) at least a portion of the multilevel wiring structure in the processor and (b) at least a portion of the multilevel wiring structure in the IPD including the inductor, such that the electrical current induces a first magnetic field that passes through the core of the inductor.

28. The assembly of claim 27, wherein the inductor induces a second magnetic field that passes through the core, the first and second magnetic fields oriented in a same direction.

29. The assembly of claim 23, wherein at least one of the passive devices includes at least one capacitor that forms a resonant impedance matching circuit.

30. The assembly of claim 29, wherein the impedance matching circuit and the inductor provide an impedance transformation at a particular frequency band.

31. The assembly of claim 23, further comprising a circuit board disposed proximal to the second side of the interposer, the circuit board electrically connected with a second wire trace on the second side of the interposer.

32. An assembly comprising:
an interposer having a plurality of wire traces, the wire traces extending from a first side to a second side of the interposer, the first and second sides of the interposer on opposing sides of the interposer; and
an integrated passive device (IPD) embedded in the interposer, the IPD including:
a substrate;
a first insulator layer disposed on the substrate;
a multilevel wiring structure defined in the first insulator layer; and
a plurality of passive devices electrically connected to the multilevel wiring structure;
wherein at least one of the passive devices includes a thin-film magnetic inductor comprising at least a portion of the multilevel wiring structure, the inductor including:
a first wiring plane of the multilevel wiring structure, the first wiring plane including a first metal wire;
a second wiring plane of the multilevel wiring structure, the second wiring plane including a second metal wire;
a vertical conductive interconnect (VIA) extending from the first wire to the second wire, the VIA electrically connecting the first and second wires;
a second insulator layer disposed between the first and second wiring planes; and
a magnetic core disposed in a hole defined in the second insulator layer,
wherein the first metal wire, the VIA, and the second metal wire comprise a conductive winding around the magnetic core.

33. The assembly of claim 32, wherein the IPD has a height less than or equal to 300 microns.

34. The assembly of claim 32, wherein the inductor has a height of 50 microns or less.

35. The assembly of claim 32, further comprising a processor chip electrically connected to a first side of the interposer.

36. The assembly of claim 35, further comprising a system on a chip (SoC) in electrical communication with the interposer, the SoC including the processor chip.

37. The assembly of claim 35, further comprising a circuit board electrically connected to a second side of the interposer, the first and second sides on opposing sides of the interposer.

38. An assembly comprising:
an interposer having a plurality of wire traces, the wire traces extending from a first side to a second side of the interposer, the first and second sides of the interposer on opposing sides of the interposer;
an integrated passive device (IPD) embedded in the interposer, the IPD including:
a substrate;
a first insulator layer disposed on the substrate;
a multilevel wiring structure defined in the first insulator layer; and
a plurality of passive devices electrically connected to the multilevel wiring structure; and a processor chip electrically connected to a first side of the interposer;

wherein the IPD and the processor chip form an integrated power converter.

39. An assembly comprising:

an interposer having a plurality of wire traces, the wire traces extending from a first side to a second side of the interposer, the first and second sides of the interposer on opposing sides of the interposer;

an integrated passive device (IPD) embedded in the interposer, the IPD including:
 a substrate;
 a first insulator layer disposed on the substrate;
 a multilevel wiring structure defined in the first insulator layer; and
 a plurality of passive devices electrically connected to the multilevel wiring structure; and a processor chip electrically connected to a first side of the interposer;

wherein a multilevel wiring structure in the processor chip is configured and arranged such that an electrical current passes through (a) at least a portion of a multilevel wiring structure in the processor and (b) at least a portion of the multilevel wiring structure in the IPD including the inductor, such that the electrical current induces a first magnetic field that passes through the core of the inductor.

40. The assembly of claim 39, wherein the inductor induces a second magnetic field that passes through the core, the first and second magnetic fields oriented in a same direction.

41. The assembly of claim 32, wherein at least one of the passive devices includes at least one capacitor that forms a resonant impedance matching circuit.

42. The assembly of claim 41, wherein the impedance matching circuit and the inductor provide an impedance transformation at a particular frequency band.

* * * * *